US010873949B1

(12) United States Patent
Li et al.

(10) Patent No.: US 10,873,949 B1
(45) Date of Patent: Dec. 22, 2020

(54) BATTERY WATCHDOG SYSTEM AND METHODOLOGY

(71) Applicant: Link Labs Inc., Annapolis, MD (US)

(72) Inventors: Patrick Li, Potomac, MD (US); Ryan Zanski, Columbia, MD (US)

(73) Assignee: Link Labs, Inc., Annapolis, MD (US)

( * ) Notice: Subject to any disclaimer, the term of this patent is extended or adjusted under 35 U.S.C. 154(b) by 0 days.

(21) Appl. No.: 16/659,601

(22) Filed: Oct. 22, 2019

(51) Int. Cl.
*G01R 31/367* (2019.01)
*H04W 72/04* (2009.01)
*G01R 31/396* (2019.01)
*H04W 52/02* (2009.01)

(52) U.S. Cl.
CPC ........ *H04W 72/048* (2013.01); *G01R 31/367* (2019.01); *G01R 31/396* (2019.01); *H04W 52/0212* (2013.01); *G09G 2330/021* (2013.01)

(58) Field of Classification Search
CPC ............ H04W 72/048; H04W 52/0212; G01R 31/396; G01R 31/367; G09G 2330/021
USPC .......................................................... 702/63
See application file for complete search history.

(56) References Cited

U.S. PATENT DOCUMENTS

| 7,251,737 B2* | 7/2007 | Weinberger ........... G06F 1/3203 713/320 |
| 2002/0065618 A1* | 5/2002 | Oh ........................ G06F 1/3203 702/57 |
| 2012/0323390 A1* | 12/2012 | Kobayasi .......... H02J 13/00004 700/295 |
| 2014/0304542 A1* | 10/2014 | Rogers ................. G01R 31/382 713/340 |
| 2017/0208426 A1* | 7/2017 | Komoni ................. G08C 17/02 |
| 2019/0208275 A1* | 7/2019 | Montgomery ..... H04N 21/4424 |

* cited by examiner

Primary Examiner — Toan M Le
Assistant Examiner — Xiuqin Sun
(74) Attorney, Agent, or Firm — Charles B. Lobsenz; Brian H. Buck; Potomac Law Group, PLLC

(57) ABSTRACT

A system incorporating a watchdog and power throttling capability which is implemented to ensure that network devices do not consume their entire battery capacity prior to the minimum expected battery life associated with the battery/device. The system includes capabilities for monitoring predicted remaining battery life in each associated device as well as the ability to control various functionalities within the device and the timing of events so as to guarantee minimum operating life for the device. This watchdog/throttling capability is implemented in such a way as to minimize the impact to device behavior and system operating parameters as much as possible while still enforcing minimum device/battery lifetime.

18 Claims, 6 Drawing Sheets

EN 14

- Transceiver
- Estimator
- GPS Receiver
- WiFi Receiver

FIG. 1A

BATTERY WATCHDOG SYSTEM AND METHODOLOGY

FIELD OF THE DISCLOSURE

Disclosed embodiments relate to wireless communications, and more specifically, to wireless communication systems and low power devices wherein battery longevity is of significant importance.

BACKGROUND

In the post-2009 evolution of the Internet towards the IoT, a segment that has experienced major growth is that of small, inexpensive, networked processing devices, distributed at all scales throughout everyday life. Of those, many are configured for everyday/commonplace purposes. For the IoT, the end nodes are comprised substantially of such small devices.

Within the small-device segment, the sub-segment that has the greatest growth potential is embedded, low-power, wireless devices. More particularly, most deployments employ large numbers of resource-limited embedded devices, which typically are battery powered, and which are typically connected to the Internet by low-power, low-bandwidth wireless networks ("LoWPANs").

The BLUETOOTH Special Interest Group devised BLE particularly in consideration of IoT devices and applications which do not require continuous connection(s), but are more interested in extended battery life. One example of such a device is a temperature sensor which intermittently provides temperature readings to a collector device that collects such periodic readings. That is, continuous connection between the sensor and collector is not necessary to obtain, for example, since temperature readings at a series of discrete points in time is sufficient for the applicable use case(s).

Battery longevity is a critical requirement in many of these systems since the devices at the end points often move around extensively and at many times can be inaccessible or otherwise difficult to access physically. For example, one ubiquitous set of use cases involves the attachment of tags to physical objects whose location is desired to be tracked. In these deployments, the tags, which must wirelessly report back to the network, do not have a predetermined, or in many cases even predictable, timeline for movement or, more generally, timeline for event initiation.

Because power draw on the embedded battery is essentially a function of the type and frequency of these events, it thus becomes difficult exercise to determine the expected battery life for an overall population of devices and/or a specific subset of devices designated for a specific task. In other words, expected battery life for these devices is typically based upon assumed behavior of the device for the targeted use case. However, in application, there is no way of ensuring that the device actually behaves as assumed and, as a result, the battery life in actual usage could be drastically different that the expected battery life. This circumstance creates problems in terms of system failures, potential loss of physical objects attached to the devices and/or system failures such as in the case where reporting to the network of required parameters is halted due to the loss of battery power.

When it is not possible to adequately predict timing to eventual power unavailability, various drawbacks result in addition to those mentioned above. For example, were it to be known when a specific device or set of devices was close to losing power, those specific devices could be targeted for battery replacement if accessible rather than attempting to replace batteries on all devices tied to the network when some of the devices did not need immediate attention. Also, vendors and system integrators in the IoT space are often asked or required to provide minimum service level commitments for battery life to their customers in connection with devices deployed in the field. These providers are then put in the unenviable position of having to either "pad" the expected battery life metrics or risk defaulting on one or more service level commitments.

Thus, it would be desirable to provide for one or more solutions that addresses and overcomes the aforementioned impediments and disadvantages now associated with IoT deployments generally and with respect to edge device battery consumption control and monitoring more specifically.

SUMMARY

It is to be understood that both the following summary and the detailed description are exemplary and explanatory and are intended to provide further explanation of the present embodiments as claimed. Neither the summary nor the description that follows is intended to define or limit the scope of the present embodiments to the particular features mentioned in the summary or in the description. Rather, the scope of the present embodiments is defined by the appended claims.

An aspect of the embodiments described herein includes a system incorporating a watchdog and power throttling capability which is implemented to ensure that network devices do not consume their entire battery capacity prior to the minimum expected battery life associated with the battery/device. The system includes capabilities for monitoring predicted remaining battery life in each associated device as well as the ability to control various functionalities within the device and the timing of events so as to guarantee minimum operating life for the device. This watchdog/throttling capability is implemented in such a way as to minimize the impact to device behavior and system operating parameters as much as possible while still enforcing minimum device/battery lifetime.

In one preferred embodiment of the present invention, system administrators may configure various aspects of device behavior and the functionality of the throttling mechanism to tailor operating performance to desired system characteristics, while again, ensuring a minimum device/battery operating lifetime.

In another preferred embodiment of the present invention, the system employs a maximum battery usage per time window methodology. According to this methodology, in each time window, the device is allotted a maximum battery consumption amount based on one or more variables. These variables may include, for example, known battery capacity, minimum expected battery life, time window duration, power consumption amounts required for discrete and mandatory device events occurring within the time window and/or battery remaining life thresholds prior to the initiation of throttling. In some embodiments, to the extent that the maximum battery consumption amount is not used in a particular time window, the unused amount may be carried forward to one or more future time windows.

In another aspect of the present invention, in preferred embodiments thereof, the low power battery operated devices are configured to track and report power consumed in real time. Accordingly, a "fuel gauge" subsystem is employed which serves to calculate predicted battery consumption based on known, measured values per event type. The fuel gauge subsystem works in conjunction with the throttling subsystem of the present invention to control the operating characteristics of the devices during each time window in which various events relating to the device may occur.

In a preferred embodiment of the present invention, various configurable parameters may be set and modified via an administrative subsystem that allows for wireless transmission of such configurable parameters to the devices as and when they are set. Examples of these configurable parameters include, for example, the amount of time comprising each time window, battery capacity, device operating lifetime to be enforced, percentage of remaining battery capacity which is required before throttling begins, and other parameters as further discussed herein.

In another aspect of the present invention, and according to one preferred embodiment thereof, certain mandatory events during time windows are designated as having too high of an importance to be subject to throttling even when throttling is otherwise applied to other event types. In the context of a device consisting of a tag which reports location for object tracking purposes, such mandatory events may include, for example, network scans, heartbeats, mode transitions, BLE transactions, and others as configured through the administrative subsystem.

With respect to these mandatory events, the system and methodologies of the present invention, in preferred embodiments thereof, may calculate battery capacity needed for mandatory events occurring in each window in various ways. In one case, a percentage remaining limit (e.g. 5-10%) can be set for these events and if battery usage is exceeded for the specific time window, the battery usage in excess of the maximum for that that window can be deducted from the next window and/or other future time windows. Alternatively, estimated battery consumption required for mandatory events can be calculated in real time based on the time remaining in the applicable time window.

Another aspect of the present invention comprises various options for throttling event activity when needed. These options may include stopping all non-priority activity until the next time window, increasing the minimum time window duration to prevent going over the maximum battery consumption requirement, or progressively increasing the time window duration once the throttling start threshold is reached. In this last case, if and when the secondary over usage threshold is reached, all non-priority events are stopped until the beginning of the next time window.

Additional aspects of the present invention may also include other supporting system and device features. These include a fuel gauge battery reset for when a device battery is replaced (or some other reason) as well as a new time window messaging capability. With respect to the latter aspect, a message may be sent at the end of a time window or at the beginning of a new window or if otherwise requested. This message may contain some or all of the following information: battery capacity consumed during the previous window, remaining battery consumption within the window, device throttling state (throttling ongoing or not), the time at which throttling began, time window length, time to the end of the current window, overall battery capacity remaining, total battery capacity and others.

In certain embodiments, the disclosed embodiments may include one or more of the features described herein. While the invention is described primarily in the context of IoT systems and related devices such as tags, it will be readily understood by one of ordinary skill in the art that the teachings herein may also be readily applied to other applications in which it is desirable to monitor battery life and control device behavior to maximize battery life.

BRIEF DESCRIPTION OF THE DRAWINGS

The accompanying drawings, which are incorporated herein and form a part of the specification, illustrate exemplary embodiments and, together with the description, further serve to enable a person skilled in the pertinent art to make and use these embodiments and others that will be apparent to those skilled in the art. Embodiments herein will be more particularly described in conjunction with the following drawings wherein:

FIG. 1A is an illustration of a BLE End Node (EN) device in accordance with FIG. 1;

DETAILED DESCRIPTION

Figure 1:
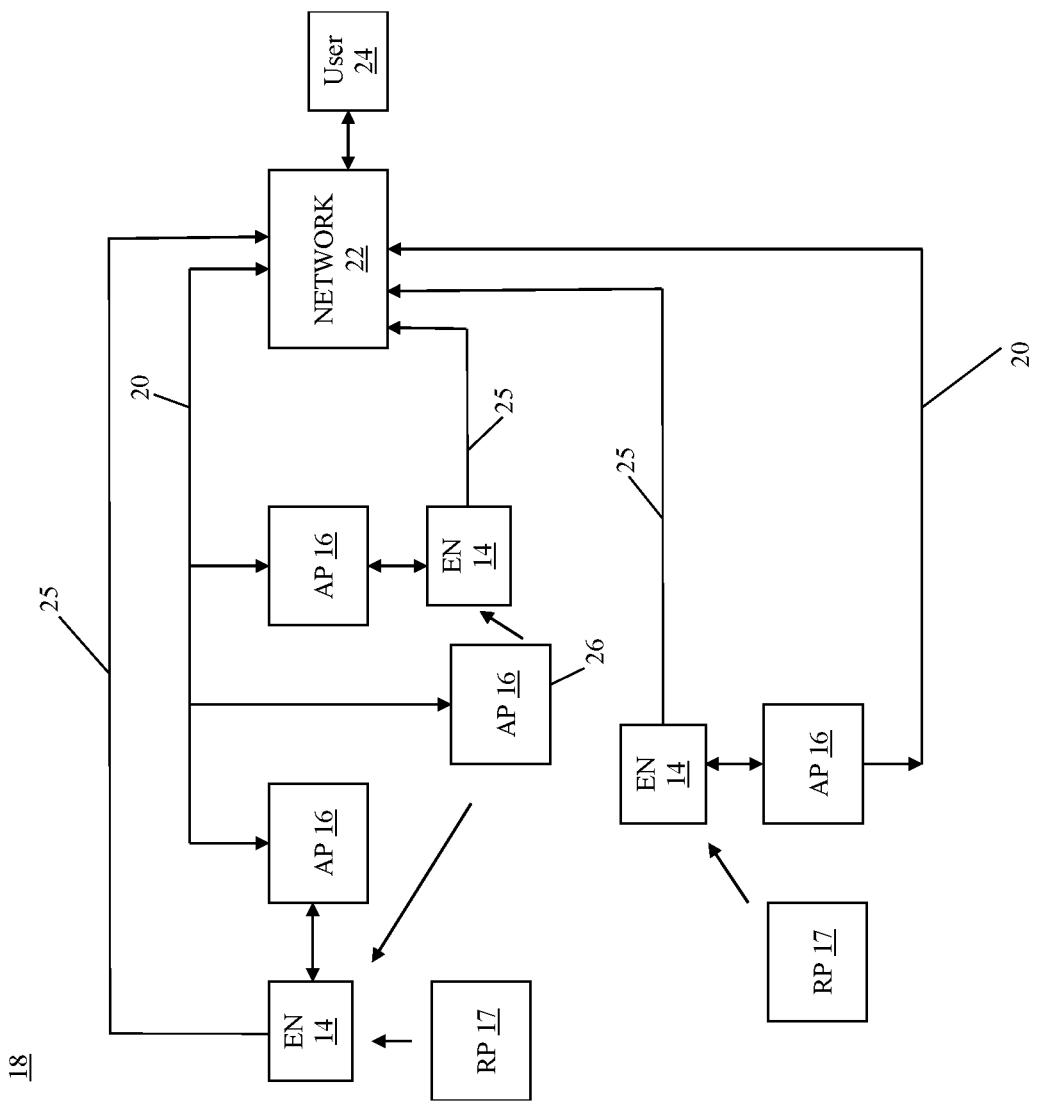
FIG. 1 is an illustration of an exemplary BLE-enabled network.

The present disclosure will now be described in terms of various exemplary embodiments. This specification discloses one or more embodiments that incorporate features of the present embodiments. The embodiment(s) described, and references in the specification to "one embodiment", "an embodiment", "an example embodiment", etc., indicate that the embodiment(s) described may include a particular feature, structure, or characteristic. Such phrases are not necessarily referring to the same embodiment. The skilled artisan will appreciate that a particular feature, structure, or characteristic described in connection with one embodiment is not necessarily limited to that embodiment but typically has relevance and applicability to one or more other embodiments.

In the several figures, like reference numerals may be used for like elements having like functions even in different drawings. The embodiments described, and their detailed construction and elements, are merely provided to assist in a comprehensive understanding of the present embodiments. Thus, it is apparent that the present embodiments can be carried out in a variety of ways, and does not require any of the specific features described herein. Also, well-known functions or constructions are not described in detail since they would obscure the present embodiments with unnecessary detail.

The description is not to be taken in a limiting sense, but is made merely for the purpose of illustrating the general principles of the present embodiments, since the scope of the present embodiments are best defined by the appended claims.

It should also be noted that in some alternative implementations, the blocks in a flowchart, the communications in a sequence-diagram, the states in a state-diagram, etc., may occur out of the orders illustrated in the figures. That is, the illustrated orders of the blocks/communications/states are not intended to be limiting. Rather, the illustrated blocks/communications/states may be reordered into any suitable order, and some of the blocks/communications/states could occur simultaneously.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items. As used herein, the singular forms "a", "an" and "the" are intended to include the plural forms as well, unless the context clearly indicates otherwise.

The word "exemplary" is used herein to mean "serving as an example, instance, or illustration." Any embodiment described herein as "exemplary" is not necessarily to be construed as preferred or advantageous over other embodiments. Additionally, all embodiments described herein should be considered exemplary unless otherwise stated.

The word "network" is used herein to mean one or more conventional or proprietary networks using an appropriate network data transmission protocol, or other specification and/or guidelines which may be applicable to the transfer of information. Examples of such networks include, PSTN, LAN, WAN, WiFi, WiMax, Internet, World Wide Web, Ethernet, other wireless networks, and the like.

The phrase "wireless device" is used herein to mean one or more conventional or proprietary devices using radio frequency transmission techniques or any other techniques enabling the transfer of information. Examples of such wireless devices include cellular telephones, desktop computers, laptop computers, handheld computers, electronic games, portable digital assistants, MP3 players, DVD players, or the like.

FIG. 1 illustrates a BLE-enabled network 18 and communications system thereof according to the present embodiments in which ENs (End Nodes) 14 detect a received signal strength (RSS) of all beacon advertisement messages transmitted from the APs (Access Points) 16 and RPs (Reference Points) 17, solely determine proximity with respect to the APs 16 and RPs 17, and further, solely initiate and establish all connections therebetween the ENs 14 and APs 16, in response to having evaluated and/or made a decision with respect to, for example, such RSS, information contained in the beacon advertisement message, and/or other information.

Once a connection between an EN 14 and an AP 16 is made, data such as, optionally, identifying information, other than location information, of the EN 14 and identifying information of, other than the connected AP 16, the most proximate AP 16 or RP 17, and contained information of the EN 14 including, for example, sensory information thereof, may be transferred to the respective AP 16 for delivery through a backhaul 20, implemented by a cellular, WiFi, or Low-Power, Wide-Area Network (LPWAN) configuration, to a network or cloud service 22 for transfer to an end user terminal 24, such as a personal computing or other electronic device enabled to convey the aforementioned information. Pertinent, unique identifying and/or location information of the APs 16 and RPs 17, such as their media access control (MAC) address, is included in each of their transmitted beacon advertisement messages and are known to the network 22. Such network or cloud service 22 includes any one of available data and connectivity platforms to allow users of nodes within network 18 to, for instance, manage and distribute information pertinent to the nodes and/or information desired in the administration of the nodes. An example of such a platform is CONDUCTOR, available from Link Labs, Inc. of Annapolis, Md.

As mentioned, EN 14 may transmit to the network 22 its own identifying in the form of, e.g., its MAC address, and other collected information, along with identifying information of the AP 16 or RP 17 which is most proximate to the EN 14. In this regard, such transmission may occur through one of two ways. Firstly, an EN 14 may transmit independently of an AP 16, through use of its own network connection capability. To do so, each EN 14 is equipped with appropriate hardware and/or software so as to send and receive information via an available backhaul 25. The backhaul 25 may comprise a LPWAN configuration, or be embodied as a network operated by a cellular provider, such as, for example, VERIZON, for delivery and receipt of information directly to and from network 22. When in the form of the LPWAN configuration, each EN 14 comprises an LPWAN transceiver and/or software compatible with, for example, the LPWAN solution known as SYMPHONY LINK, and available from the aforementioned Link Labs, Inc., though other solutions are also contemplated. In this way, backhaul 25 may be implemented so as to reduce the costs and occasional unavailability of cellular transmission. When in the form a cellular network, each EN 14 comprises a cellular transceiver in accordance with, for example, Global System for Mobiles (GSM), or Long-Term Evolution (LTE), including Cat-M1 or NB-IoT. Secondly, an EN 14 may transmit through a connected AP 16 (as explained in detail below).

Further, it is to be understood that, while communications between an EN 14 and AP 16 are discussed herein in the context of the BLE protocol, it is contemplated that such communication may also be optionally achieved according to another wireless protocol, as appropriate. Also, it is to be understood that EN 14 and AP 16 are exemplary of first and second network nodes, respectively, which may be similarly configured as are EN 14 and AP 16 to carry out communications with respect to the BLE networking described herein and/or according to the other, appropriate wireless protocol discussed above.

In an exemplary case in which a respective EN 14 is mobile, the EN 14 is configured with a locator comprising an estimator implemented by all appropriate software and/or hardware for estimating proximity to a given AP 16 or RP 17, based on RSS, and is also configured with appropriate software and/or hardware for performing all operations associated with initiating and/or establishing a connection with an AP 16.

Selection of an AP 16 or RP 17, as the source of one or more beacon advertisement messages, and making it most proximate to the EN 14, is determined as that which yields the highest confidence value. However, if a further AP 16 or RP 17 yields a next most confident value corresponding to a predetermined tolerance for the confidence value, selection of the AP 16 or RP 17 that is most proximate to the EN 14 is determined from among all of the APs 16 and RPs 17 which have broadcast a beacon advertisement message received by the EN 14. Still further, a signal strength from a respective AP 16 may be adjusted, in accordance with an adjustment factor conferred by network 22 and included in the beacon advertisement message, to confer exclusive selection thereof by the EN 14, i.e., any other AP 16 or RP 17 whose beacon advertisement message the EN 14 has received is excluded from being considered as being most proximate to the EN 14. It is to be understood that the estimator of a particular EN 14 may be configured to create a statistical fingerprint of AP 16 and RP 17 associations so as to optimize interpretation of future association patterns.

In connection with the above, the EN 14 is further configured to self-transmit to the network 22 its own identity, e.g., its MAC address, collected information applicable to an above-discussed application environments, and positional information, i.e., information which is determinative of a location of the EN 14 without reference or attribution to an AP 16 or RP 17, along with any other information pertinent to the EN 14 as described herein. To do so, EN 14, as is shown in FIG. 1A, includes a communicator comprising a transceiver, such as, for example, either a CAT-M1 or other cellular enabled modem, or a LPWAN compatible construction, each of which is respectively operable with backhaul 25. Operatively connected with the communicator is a locator comprising one or more of the aforementioned estimator, a Global Positioning System (GPS) receiver and a WiFi receiver. Optionally, each of the above modem, estimator, and receivers may comprise a system on a chip (SoC), so as to include a microprocessor (not shown).

Because EN 14 includes the above-discussed cellular modem, positional information of the EN 14 may be determined by network 22 according to the cellular ID (CID) of the base transceiver station (BTS) with which the EN 14 is in communication. That is, when transmitting its positional information to the network 22, the CID is delivered upstream to the network 22, which is then enabled to access a mapping of the BTS as administered by a cellular provider with rights to the BTS, such as VERIZON, AT&T or similar network operators. With this mapping, a relative location of the EN 14, comprising the latitude and longitude of the communicating BTS, may be learned and attributed, by network 22, to any EN 14 that transmitted information to the network 22 via its cellular modem.

When configured with a GPS receiver, EN 14 determines its positional information as latitude and longitude as would, for example, a smartphone or other computing device executing GOOGLE MAPS or another known global positioning application. When configured with a WiFi receiver, EN 14 is enabled to obtain, for one or more wireless local area networks (WLANs), such as a WiFi network or networks, positional information including received signal strength indicators (RSSIs) for detected networks, service set IDs (SSIDs) representing a name of a particular WiFi network, and basic service set IDs (BSSIs) representing the MAC address of access points within the detected network.

With this information, and particularly BSSIs for detected networks, the EN 14 is then able to communicate detected addresses to network 22. Network 22 then coordinates access to positioning databases for WiFi networks, including, for example, that which is administered by GOOGLE. Through this coordination and matching of these addresses, a relative location of the EN 14, comprising a latitude and longitude for the detected addresses, may be determined and attributed, by network 22, to the EN 14.

When configured with any combination of location determining software and/or hardware including the estimator, GPS receiver and the WiFi receiver, as described above, network 22 is configured to calculate and determine the relative location of the EN 14 within a predetermined tolerance of positional latitude and longitude coordinates. Such determination may occur, for instance, in a case in which the network 22 determines a location of an EN 14 using a combination of, for example, GPS coordinates and WiFi derived coordinates, though other combinations are contemplated. For example, such another combination may comprise a known location of the most proximate source of received beacon advertisement messages, GPS coordinates and WiFi derived coordinates.

In one or more embodiments, operability of the communicator and locator may be executed according to an application comprising a set of computer-readable instructions configured to be stored on and accessible by a computing device, such as a smartphone or other personal computing device, for execution thereby. This way, such a computing device may be transformed to comprise the EN 14 so as to leverage the operating system, GPS, WiFi and other data collection capabilities thereof.

Figure 2:
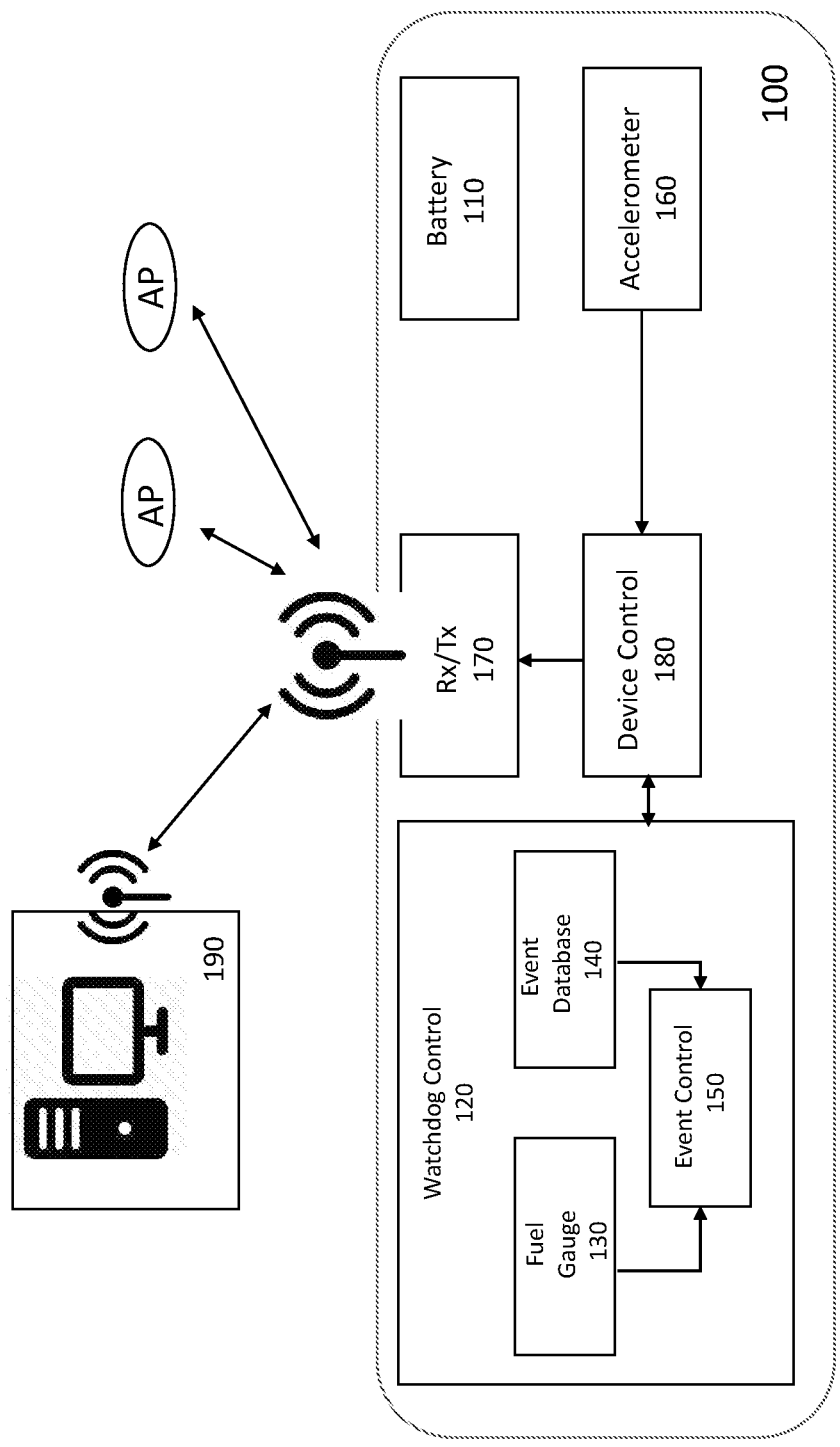
FIG. 2 is a block diagram illustrating a low power device and the components thereof in a preferred embodiment of the present invention.

Turning now to FIG. 2, a block diagram of a low power device and the components thereof, in a preferred embodiment of the present invention, is provide. For purposes of the following description, it is assumed that the low power device is a BLE tag functioning in accordance with the description of EN 14 above. However, it will be readily understood that the teachings of the present invention may be easily applied to other low power wireless devices including other IoT devices such as various sensors, tags, and remote monitoring devices that communicate data back to an access point or other central repository via any form of wireless communication.

According to one embodiment of the present invention, tag 100 comprises various components which are now described. Tag 100 communicates wirelessly with at least one administrator node 190 as well as one or more APs. Tag 100 includes at least one battery 110 which provides stand-alone power to tag 100 for all necessary operations and activities implemented by tag 100. In some embodiments, battery 110 may be replaceable while in other embodiments, it is not expected that tag 100 would continue to be usable after battery 110 is exhausted. In a preferred embodiment of the invention, the capacity of battery 110 is known to tag 100 as described in further detail below and further, at initial deployment (whether for tag 100 generally or in the case of a battery replacement), battery 110 is at full capacity. Typical capacity of battery 110 is, for example, 6 amp-hrs in the case of a tag 100 which is suited for affixing to various components which are to be tracked for physical location.

Tag 100 also includes a receive/transmit capability 170 which permits tag 100 to wirelessly receive and transmit data according to one or more protocols such as Wifi, BLE, cellular and/or others. Control of operations and general control of the functionality of tag 100 is provided by device control 180 which may be, for example, a microprocessor suited for such operations as sensing and processing various external parameters such as location, temperature, pressure, position and other aspects associated with the physical environment in which tag 100 is located. Device control also functions to manage the timing and content of communications to and from tag 100 via receive/transmit capability 170. Along these lines, device control communicates with and interoperates with watchdog control 120 so as to manage the timing and control of events initiated within tag 100 for the purpose of managing power usage over the life of battery 110.

In a preferred embodiment of the present invention, tag 100 also includes accelerometer 160 which functions to alert device control 180 when tag 100 physically moves. As explained in further detail below, this capability allows for tag 100 to go into various low power states when tag 100 is stationary for lengthy periods of time. In the context of tag 100 providing location information to APs, this is beneficial since a stationary tag does not require location updates to be transmitted thus saving power in battery 110. In various embodiments, then, accelerometer 160 is employed to awaken tag 100 from a "sleep" state once tag 100 is moved.

According to the present invention, tag 100 also includes watchdog control 120 which itself includes a number of components. One such component is event control 150 which interoperates with other watchdog control components as well as device control 180 to manage the initiation or suppression of events within tag 100 as further described below. Event control 150 communicates with fuel gauge 130 which provides an estimated remaining life of battery 110 based on an initial known battery 110 capacity as well as the tracking of events initiated by tag 100 and an estimated battery drain amount associated with each such event as these events occur. Estimates for battery drain associated with each possible event type is stored in event database 140. These estimates are based on tests conducted and may be hardcoded into event database 140 and/or provided and updated by a system administrator.

One or more system administrators may access and configure various operational characteristics of tag 100 generally and watchdog control 120 more specifically via administrative subsystem 190. Administrative subsystem 190 communicates wirelessly with tag 100 from time to time including in cases where a system administrator desires to re-configure watchdog control 190. Wireless communication between administrative subsystem 190 and tag 100 may be via any of the wireless protocols described above with respect to communication between tag 100 and APs or other protocols may also be used. Alternatively, a wired connection between administrative subsystem 190 and tag 100 may be employed to, for example, permit easy configuration of tags 100 as the are set up for initial deployment. In various embodiments, configuration commands communicated by administrative subsystem 190 may be communicated to and applied by multiple tags 100 at the same time.

Figure 3:
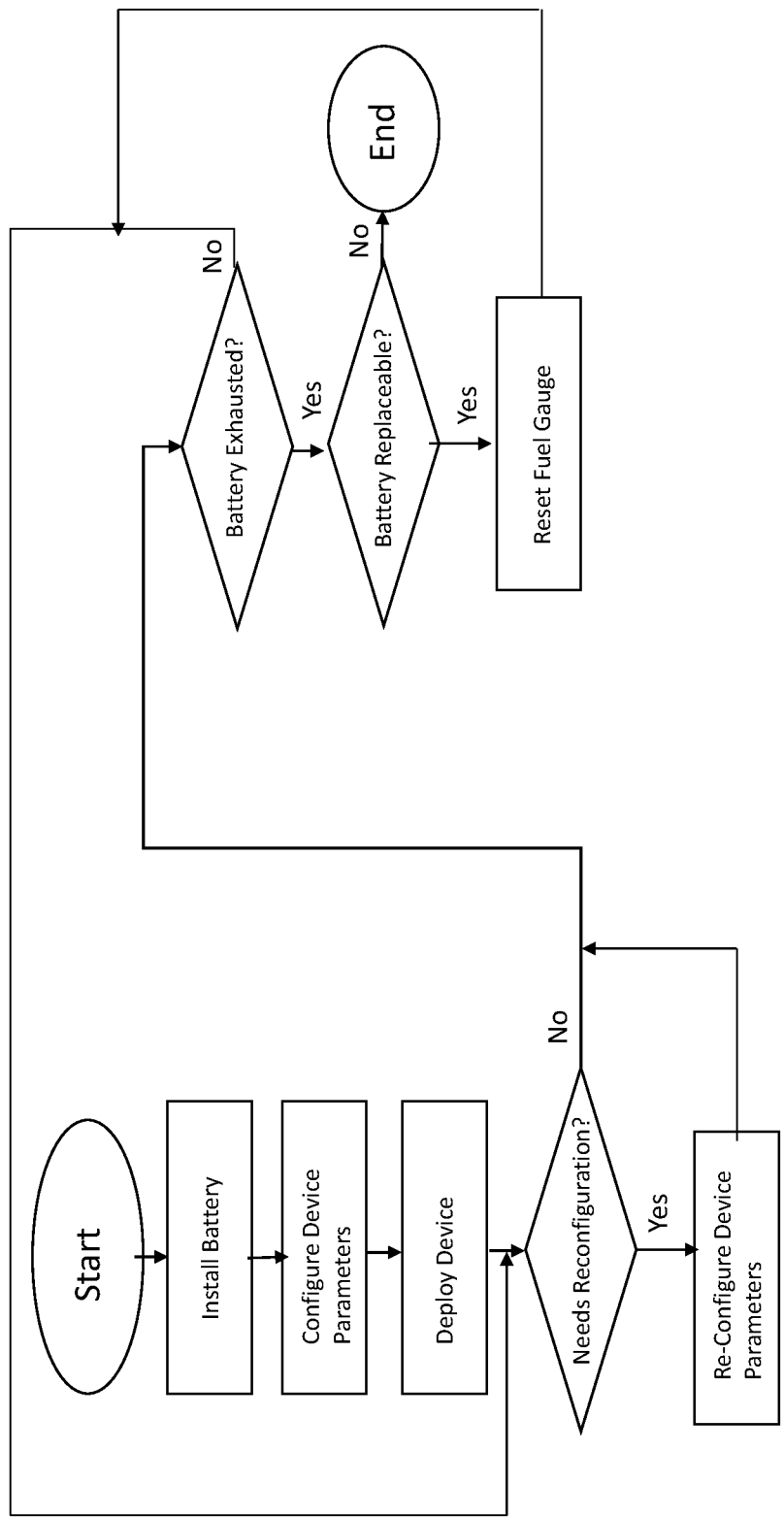
FIG. 3 is a flowchart illustrating the process by which devices may be configured in both battery replaceable and non-battery replaceable scenarios according to the teachings of the present invention in a preferred embodiment thereof.

With reference now to FIG. 3, a discussion of the device configuration processes in both battery replaceable and non-battery replaceable scenarios is provided. The process initiates at the Start step. Following this, one or more batteries 110 is installed within tag 100. Prior to the deployment of tag 100, the various parameters associated with tag 100 and in particular watchdog control 120 is accomplished by an administrative user. These parameters and the selection thereof are discussed in more detail below. In a preferred embodiment, the parameters are set via administrative subsystem 190 and then communicated to tag 100 either wirelessly or via a wired connection.

At the next step, tag 100 is deployed in the field and begins processing events and using power within battery 110 accordingly. If at some point, parameters associated with watchdog control 120 need to be modified, this may be done while tag 100 is deployed in the field via administrative subsystem 190 and the wireless communication of any changed parameters to tag 100. In a preferred embodiment, as mentioned above, parameter changes for multiple tags 100 may be made via a batch communication from administrative subsystem 190 to such a set of tags 100 targeted for parameter changes.

At some point, battery 110 may become exhausted or close to exhausted. At this point, a notification may be sent by tag 100 to administrative subsystem 190. In this case, if battery 110 is not field replaceable, the applicable tag 100 will be marked by administrative subsystem 190 as inactive or about to be inactive. Alternatively, if battery 110 is field replaceable, then tag 100 may be physically located and battery 110 may be replaced by a qualified person. Upon replacement, tag 100 may signal fuel gauge 130 associated with battery 110 to be reset to full capacity, or, alternatively, this reset to full capacity may occur by manually updating fuel gauge remaining capacity level via communication from administrative subsystem 190 to tag 100. With the battery replacement, tag 100 may now continue to function as it had before battery replacement with the execution of events under the control of watchdog control 120 as configured.

In some embodiments, tag 100 may report the amount of cumulative energy consumed at various points in time (such as when a heartbeat is sent) to administrative subsystem 190. Administrative subsystem 190, in this case, may be configured with the starting battery capacity for tag 100 and then administrative subsystem can calculate battery state through the use of the overall consumption as reported to administrative subsystem 190 by tag 100. In these embodiments, administrative subsystem 190 then periodically reports estimated remaining battery capacity to tag 100 so that tag 100 can throttle various events as described herein based on battery capacity.

Figure 4:
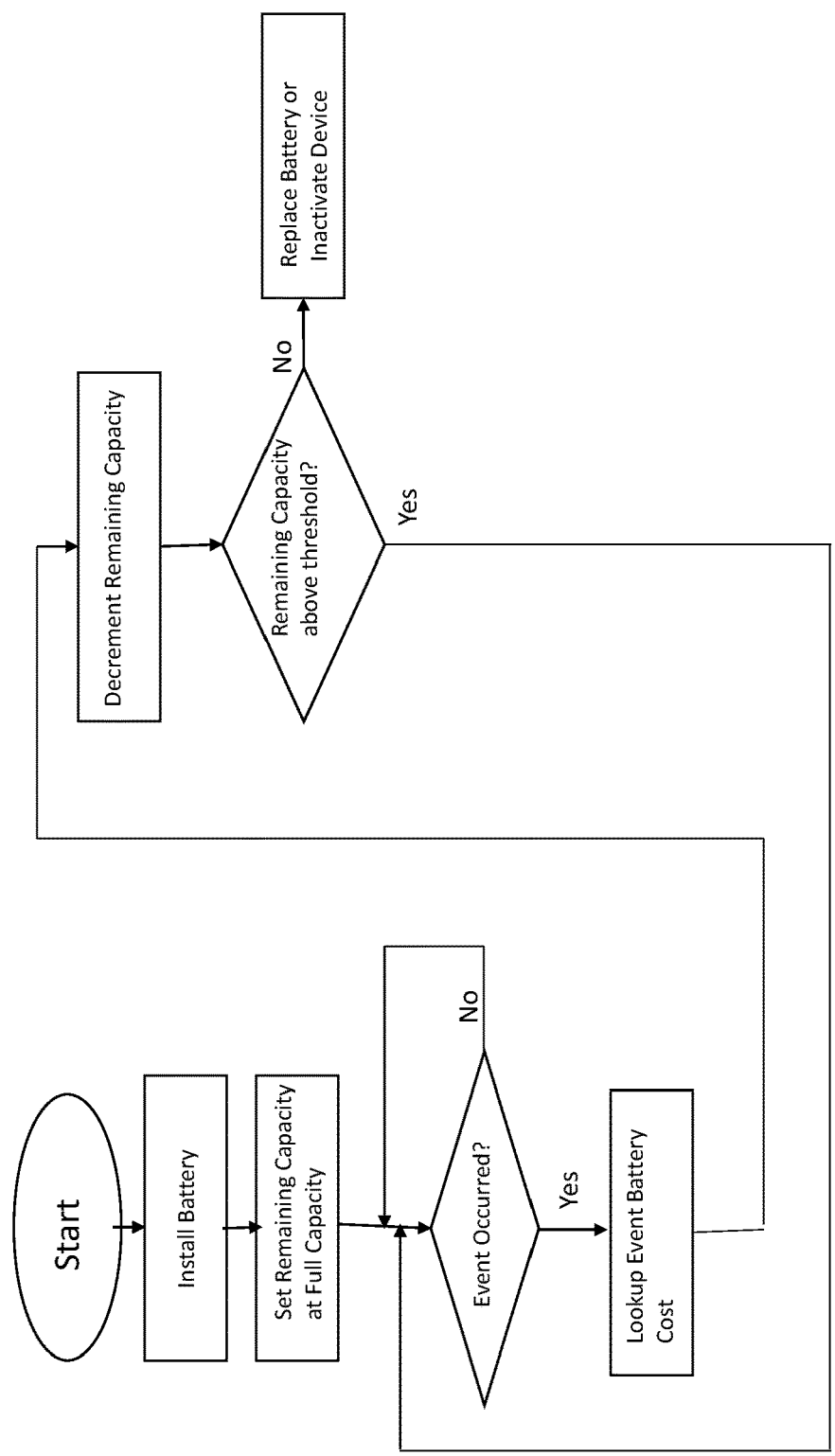
FIG. 4 is a flowchart illustrating the process by which the battery fuel gauge of the present invention operates in a preferred embodiment.

Turning now to FIG. 4, a discussion relating to the operation of fuel gauge 130 of the present invention in a preferred embodiment thereof, is provided. According to the present invention, fuel gauge 130 is included so as to track the estimated remaining battery capacity. By doing this, various decisions can be made, based on configurable options, regarding timing and frequency of various events that would normally be carried out by tag 100. Because a hardware based coulomb counter uses a relatively large amount of energy, it is not particularly suitable for low power applications such as those contemplated herein. Instead, in a preferred embodiment of the present invention, fuel gauge is used to estimate remaining battery capacity based on a starting capacity and estimated power usage for known events as they take place. These estimates can be derived on the bench and loaded within event database 140 for use by watchdog control 120 as tag operates in the field.

It will be understood that in various applications, there is a practically unlimited set of events that could be initiated and implemented by various sets of devices including those which might be implemented by tag 100. Exemplary events in the context of the EN 14 described above might include the following:
  Successful CAT-M1 transaction
  Unsuccessful CAT-M1 transaction
  BLE location scan
  BLE location update
  GPS scan
  WiFi scan Many others are also possible. Also, in a preferred embodiment of the invention, tag 100 keeps track of remaining battery capacity even when it is unable to communicate (via CAT-M1 network or otherwise) back to APs and/or administrative subsystem 190. At such point in time that tag 100 returns to a location that permits such communication, the information regarding remaining battery capacity can be communicated back to the network at that point. In addition, in some embodiments, a user and/or administrative subsystem 190 of its own accord, may periodically query tag 100 to request it to report remaining battery capacity and/or event type transaction counts. With respect to the latter request, this information can be used to determine how tag 100 was behaving while outside of network coverage.

Referring specifically now to FIG. 4, the process undertaken by fuel gauge 130 in preferred embodiments is now described. The process starts upon installation of battery 110 in tag 110 or possibly sometime later if configuration occurs at some discrete time following battery installation. In any event, at some point in time after battery 110 is installed, the known full capacity for battery 110 is set within the network (i.e. via configuration using administrative subsystem 190 by setting the battery capacity and associating it with an identifier for the specific tag 100 being configured).

Once full battery capacity is set, tag 100 may be deployed for use. During operation in the field, watchdog control 120 monitors for potential tag 100 events to be executed. This is necessary for two purposes: 1) to permit watchdog control 120 to cause some events not to be carried out based on configuration, event type and battery status as discussed further below; and 2) to alert fuel gauge 130 to events that are actually carried out by tag 100 so that estimated battery capacity can continue be updated as battery usage actually occurs.

With respect to the latter purpose and in the case where an event is actually carried out, watchdog control 120 matches the event with an event type and an estimated battery usage value associated with that event type is located within event database 140. Next, the estimated battery usage value is subtracted from the most recent value for remaining battery capacity. If and when the new value for remaining battery capacity drops below a pre-defined threshold, this may trigger a notification to administrative subsystem 190 of a low battery, a request to replace the battery and/or a notice that the applicable tag 100 should be considered inactive due to a low battery state.

Figure 5:
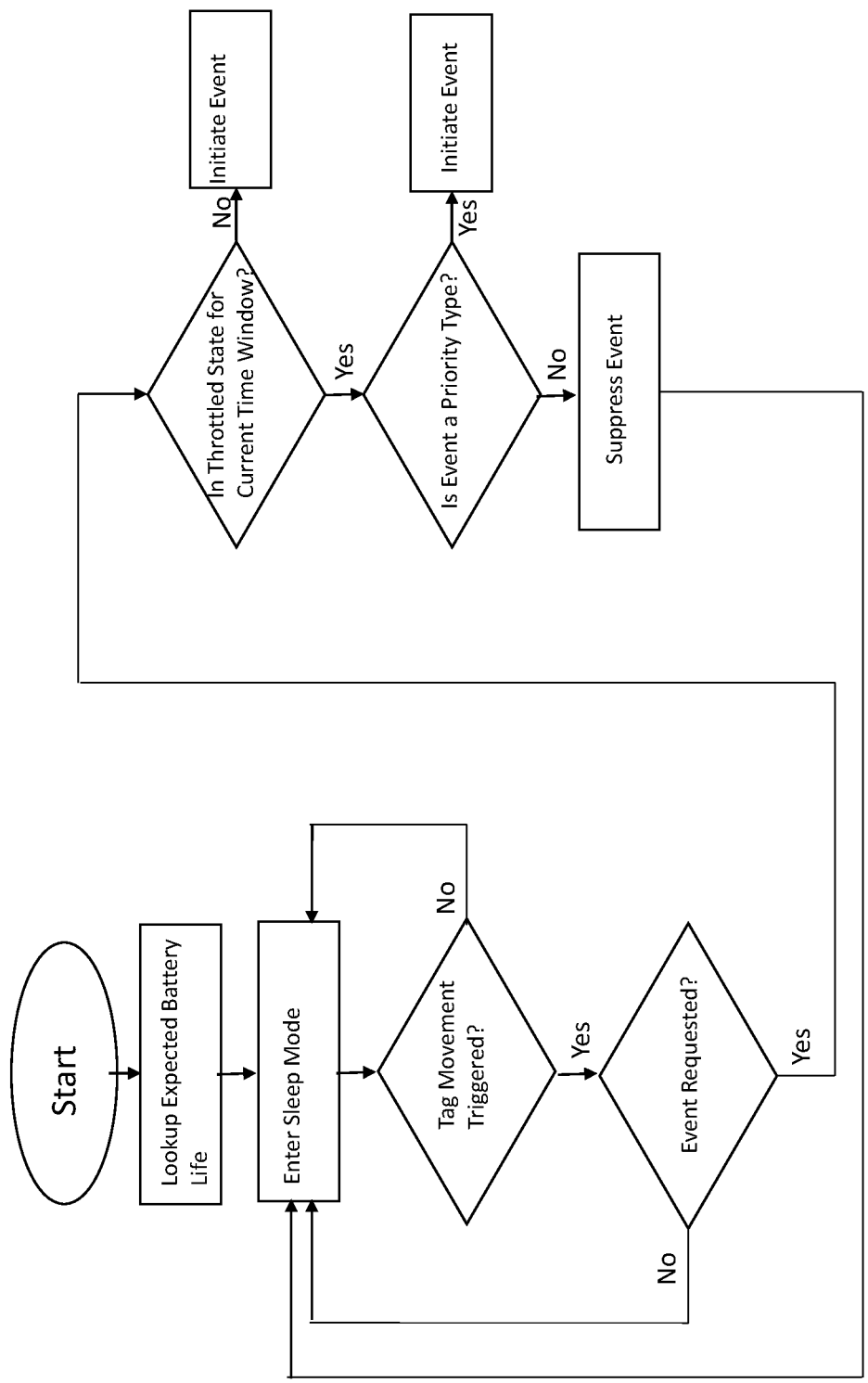
FIG. 5 is a flowchart illustrating the process by which the watchdog control of the present invention selectively controls the execution of various events.

Turning now to FIG. 5, a discussion is now provided with respect to the operation of watchdog control 120 in controlling the timing and frequency of events such that battery life may be extended and such that expected battery longevity can be enforced. In connection with this discussion, additional details are provided regarding the operation of watchdog control 120 in terms of controlling whether or not specific events are allowed to take place during specific time windows based upon various configuration settings, battery condition as well as other factors.

The process begins at START at which point watchdog control 120 looks up the expected battery life for battery 110 which is to be enforced. This value may be provided through administrative subsystem 190 and then stored within watchdog control 120. Based on this value as well as the battery usage values associated with various possible events (stored in event database 140) and also various configuration settings, watchdog control 120 may determine/look up any or all of the following:
  Time window duration
  Remaining battery charge amount triggering throttled state
  Maximum battery usage during each time window
  Priority events not subject to throttling
  Carry forward parameters for future time windows in case of over-usage or underusage during the current time window Initially tag 100 is in a low power draw sleep mode. According to preferred embodiments of the present invention, tag 100 can immediately awake out of sleep mode upon an indication from accelerometer 160 that tag 100 has moved or is in the process of moving. This represents physical movement which may occur from various physical forces such as vibrations, jostling, a small location move effected by someone or something moving an object to which tag 100 is affixed or any other movement (large or small) occurring with respect to tag 100 itself.

Once tag movement is detected by accelerometer 160, tag 100 awakens from sleep mode and it is determined whether an event is to occur. Event occurrence may be based on scheduling (e.g. report location every four hours), a threshold movement amount (e.g. tag 100 GPS location shows movement of more than 100 yards from prior location), external conditions (e.g. temperature measured is more than 10 degrees higher than a previous reading) or other causes. Events are considered any function by tag 100 that will use energy from battery 110. Examples of events include the requirement to make various wireless transmissions back to the network (e.g. report location via WiFi, report location via CAT-M1, scan for WiFi coverage, etc.).

Watchdog control 120, in preferred embodiments, establishes time window durations for managing event control. These time windows may be calculated by watchdog control based on various factors or, alternatively, the time window duration may be a configuration option that may be set via administrative subsystem 190. For each discrete time window, a maximum battery power usage is established. For example, a time window duration may be 1 day and maximum permitted battery usage for each such day might be on the order of 0.05 Amp-Hrs. By configuring time windows and maximum usage during each window, an overall battery longevity can be established and enforced.

When tag 100 is awakened from sleep mode and then an event is requested, watchdog control 120 must assess whether to permit the event to occur or not. In other words, watchdog control 120 determines whether the expected battery draw will be allowed to occur during the time window based on various factors. In particular, watchdog control 120 will assess the amount of battery draw that has occurred up to the present time since the beginning of the current time window ("Draw Used"). Watchdog control 120 will then compare this against the maximum amount of battery draw to be permitted during each applicable time window ("Draw Permitted"). It will be readily understood that Draw Used is made available based on operation of fuel gauge 130 as previously discussed. Fuel gauge 130 tracks the power draw for each event that has previously been executed during the current time window such that an aggregate power draw for the current window to date is available.

If the Draw Used is below the Draw Permitted, then tag 100 will remain in a non-throttled state and the event will be permitted to occur. Alternatively, if Draw Used is in excess of Draw Permitted then tag 120 will either enter or remain (as applicable) in a throttled state for the remaining duration of the current time window.

If tag 120 is in a throttled state, then by default, the requested event will be suppressed and might be re-attempted during the next time window. One exception to this is if the requested event is designated as a "priority event" which is important enough to be required to be implemented regardless of battery state and/or battery usage during the applicable time window. Such events might include, for example, transmission of an indication that a battery is about to be exhausted or a transmission indicating one or more tag fault occurrences. These events, as configured, are not subject to throttling and may be selected for execution even in a throttled state.

It is also possible to employ both the throttled state status with remaining battery capacity to make determinations as to whether specific events may be executed during a time window or whether they should be suppressed. For example, certain event types might be permitted to be executed even in a throttled state if a remaining battery capacity exceeds a certain threshold. In this case, some event types might also be prevented from execution regardless of remaining battery capacity so long as the time window is in a throttled status.

Another aspect of the present invention is that certain carryovers and/or deductions may be made from a time window to future time window(s). In other words and for example, it may be that the execution of priority type events in a throttled state during a time window is tracked and the excess battery usage above the maximum permitted draw for these events is then subtracted from the permitted usage during the next time window. Alternatively, that excess usage during the current time window could be subtracted over the course of the next x number of time windows. For example, if two priority events are permitted to occur during a throttled state in the current time window, and if those two events cause the Draw Permitted to be exceeded by 0.01 Amp-hrs, then that 0.01 Amp-hrs may be subtracted from the Draw Permitted during the next to occur time window. Alternatively, and for example, 0.005 Amp-hrs could be subtracted from the time window after the current window and that same amount could be subtracted from the time window after that.

In some embodiments, it is also possible to carry over underused power draws from a current window to the next window and/or to multiple future time windows. An example of this is a case where tag 100 never enters a throttled state during a current time window because Draw Used is significantly below Draw Permitted by the time the current time window ends. In this case, the difference between to two values (the amount permitted but not used) can be added to Draw Permitted values for the next time window and/or allocated over multiple future time windows.

Now that the principles of the present invention have been described in detail, an exemplary use case is now discussed to provide additional insight into the processes and systems of the present invention in preferred embodiments thereof. Assume the following:

1. A tag with a 6 Amp-Hr battery is attached to a transportable water pump that is used in a paper mill to support paper production.
2. The battery needs to last 3 years.
3. The objective is to be able to locate and determine when a pump left the parent facility, when it arrived at a customer facility, and how long it has been at a customer facility, and when it returns to the parent facility.

The following challenges exist:

1. There may not be CAT-M1 cellular coverage in the customer facility. Hence, once a tag arrives at the facility and is moved inside, the tag may not be able to connect to the network to report its location. From the network's point of view, the tag just disappears and stops sending heartbeat or location update messages.
2. The length of the trip from the parent facility to a customer facility can have a large variation (i.e. one trip could be 2 hours; another could be 2 days).

3. To achieve the desired 3 year battery life, the number of cellular transactions must be strictly limited, and the tag must be in deep sleep most of the time.

Watchdog control 120 may thus operate as follows:

1. To help minimize the number of cellular transactions, accelerometer 160 is used to detect periods of no motion to allow the tag to stay in deep sleep instead of waking up to perform and report a location measurement. In other words, scheduled location updates happen only if motion is detected in the interval, and is otherwise skipped if no motion is detected in that interval.
2. Using accelerometer 160 can greatly increase the battery life of the tag (by reducing the number of CAT-M1 transactions that are needed to report location changes), but there isn't any way to enforce the assumption of how often the device is "in motion". For example, if we assume the pump is in transport 3 days every 30 days, then we could assume accelerometer 160 detects no motion 90% of the time. If the tag is actually in motion all the time, the estimated 3 year battery life could turn into only a few months of battery life. For example, when the pump device is at a customer facility and in operation pumping water 24 hours a day, accelerometer 160 would likely be triggered even though the tag was sitting in the same location. Because of the vibration from the pump, the tag would update location at its "I'm moving" location update rate and burn out the battery much more quickly than estimated based on the estimate of how often it is in transit.
3. In the case where the tag is on an operating pump (24×7) in a facility that does not have CAT-M1 coverage, it would never be known that the battery was being consumed at a much higher than estimated rate because the network would never receive any data from the tag while it was inside the facility on an operating pump.
4. The purpose of the fuel gauge 130 is to allow the tag to track its energy consumption without using a power consuming hardware based component.
5. The energy consumption for each type of "event" that can happen on the tag is measured on a bench—for example:
   Successful CAT-M1 transaction;
   Un-successful CAT-M1 transaction;
   BLE location scan;
   BLE location update
   GPS scan;
   Wifi Scan;
   etc.
6. The number of transactions of each type from when the tag started operating (i.e. battery installed) is tracked
7. The tag is configured with its battery capacity
8. The tag calculates based on quantity and type of transactions how much energy has been consumed and how much energy remains.
9. The tag keeps track of this information even when it is unable to communicate via the CAT-M1 network.
10. Eventually, if the tag gets back into network coverage, the information regarding its remaining battery capacity is communicated to the network.
11. The network is able to query the tag to request it to report its transaction type counts to know how the tag was behaving while it was out of network coverage.
12. Watchdog control 120 ensures that the tag does not exceed its assumed power consumption over a configurable interval to ensure that the tag lasts the overall predicted length of time targeted (i.e. 3 years).

For the tag on the transportable water pump, the tag might be configured to report location once every 4 hours when "moving" and outside of the local network. Hence, when it is being transported on a truck, it would experience vibrations causing the tag to report its location via CAT-M1 once every 4 hours. Once it arrived at the customer facility and was placed on the loading dock, it would be stationary and shift to reporting a heartbeat once per day (configurable parameter).

Once the pump is placed in operation (and the pump is running), the tag would believe it was in motion all the time, causing it to report locations every 4 hours while the pump was in operation. If battery life was estimated based on tag being stationary 80% of the time, and it is actually only stationary 20% of the time, then battery life would be reduced to 1 year.

With watchdog control 120 configured to manage power over a 1 week interval, the tag on an operating pump would send its location update every 4 hours for 1.5 days (for example) and then go into a throttled mode sending only heartbeats once per day (for example) until the 1 week time window had expired, and then allow the tag to run again at its 4 hours per day location update rate when moving. The throttling could be an escalating interval between location updates before going to heartbeat only mode—or using only Wifi and avoiding GPS, etc., etc. until the time window expires, returning the tag to its configured mode of operation.

If the 1 week time window expired and there was an energy "credit", then that credit could be applied to the next time window.

The system can function in the same way whether the tag was in CAT-M1 coverage (or not).

Hence, by managing the power consumption by interrupting normal behavior, we can guarantee a predicted battery life.

There could be cases where the location updates for a pump that was being moved might be missed when a tag is in throttled mode, but it ensures that the pump would eventually be located within the targeted battery life if it stays long enough in an area with CAT-M1 coverage.

If the interrupted behavior is not desired, and users prefer having battery life variation, this feature could be disabled.

Although the present embodiments have been described in detail, those skilled in the art will understand that various changes, substitutions, variations, enhancements, nuances, gradations, lesser forms, alterations, revisions, improvements and knock-offs of the embodiments disclosed herein may be made without departing from the spirit and scope of the embodiments in their broadest form.

What is claimed is:

1. A battery watchdog control system for enforcing battery power consumption constraints, the battery watchdog control system comprising:
   a battery for powering operations on a device;
   storage comprising a plurality of pre-calculated and pre-stored estimated battery usage values each respectively corresponding to said operations;
   a remaining battery capacity determination module, said remaining battery capacity determination module operating to determine, for each determination thereof, an estimate of remaining power capacity associated with said battery, based on a difference between (a) a current battery capacity and (b) solely one or more of said pre-calculated and pre-stored estimated battery usage values respectively corresponding to one or more of said operations, wherein said estimate differs from an actual level of remaining power capacity associated with said battery and defines a determined level of prospectively remaining power capacity;

a throttled state determination module configured to communicate with said remaining battery capacity determination module, said throttled state determination module operating to selectively place said device in either a throttled state or a non-throttled state, based on a comparison of said estimate of remaining power capacity associated with said battery and a predetermined threshold for said remaining power capacity;

an event control module configured to communicate with said remaining battery capacity determination module and said throttled state determination module, said event control module operating to selectively permit or prevent said operations on said device from being carried out;

wherein said event control module selectively prevents at least one type of operation from being carried out when said device is in said throttled state and wherein the carrying out of an operation of said at least one operation type would cause battery usage in excess of said predetermined threshold.

2. The system of claim 1 wherein said selective prevention of at least one type of operation from being carried out is dependent upon whether or not the carrying out of an operation of said at least one operation type would cause battery usage in excess of a predetermined value of battery usage during a time window of defined duration.

3. The system of claim 2 wherein said defined duration of said time window is set via an administrative subsystem.

4. The system of claim 2 wherein at least one type of operation is permitted to be carried out during a current time window regardless of whether said device is in said throttled state provided that a predetermined value for battery usage associated with at least one subsequent time window following said current time window is reduced to a value below a predetermined value for battery usage associated with said current time window.

5. The system of claim 2 wherein if an aggregate value for battery usage during a current time window is less than a predetermined value for battery usage associated with said current time window, then a predetermined value for battery usage associated with at least one subsequent time window following said current window is increased to a value above the predetermined value for battery usage associated with said current time window.

6. The system of claim 1 wherein said remaining battery capacity determination module is resident on said device.

7. The system of claim 1 further comprising an administrative subsystem accessed by an administrator and in communication with said device, said administrative subsystem receiving instructions from said administrator which are implemented as one or more parameters associated with battery power consumption constraints.

8. The system of claim 7 wherein said remaining battery capacity determination module is resident on said administrative subsystem.

9. The system of claim 1 wherein said throttled state determination module selectively places said device in said throttled state once said estimate of remaining power capacity associated with said battery falls below said predetermined threshold.

10. The system of claim 1 wherein at least one type of operation is permitted to be carried out regardless of whether said device is in said throttled state.

11. A computer-implemented method of enforcing battery power consumption constraints in a device, the method being implemented in a computer system comprising one or more processors configured to execute computer program modules, the method comprising the steps of:

storing at least one pre-calculated, estimated battery usage value associated with an event type, such that the pre-calculated, estimated battery usage value is pre-stored;

receiving an indication that an event associated with said event type is planned for execution;

determining, for a current time window, an estimated remaining battery capacity defined by a difference between (a) a predetermined aggregate battery usage value and (b) solely said pre-calculated and pre-stored estimated battery usage value, wherein said estimated remaining battery capacity differs from an actual level of battery usage associated with said battery and defines a determined level of prospectively usable power capacity;

determining, based upon said battery usage value associated with said event, whether said execution of said event will exceed said predetermined aggregate battery usage value associated with said current time window; and preventing said event from being executed in the event that said execution of said event will exceed any of said estimated remaining battery capacity and said predetermined aggregate battery usage value associated with said current time window.

12. The method of claim 11 wherein any further events planned for execution during said current time window are prevented from being executed in the event that a previous planned event exceeded said predetermined aggregate battery usage value associated with said current time window.

13. The method of claim 12 wherein said device comprises an accelerometer for awakening said device from a sleep mode in which no events are planned for execution.

14. The method of claim 11 wherein further non-critical events planned for execution during said current time window are prevented from being executed in the event that a previous planned event exceeded said predetermined aggregate battery usage value associated with said current time window and wherein critical events planned for execution during said current time window are not prevented from being executed even in the event that a previous planned event exceeded said predetermined aggregate battery usage value associated with said current time window.

15. The method of claim 11 wherein when aggregate battery usage during a current time window is less than said predetermined aggregate battery usage value, said predetermined aggregate battery usage value is increased for at least one time window subsequent to said current time window.

16. The method of claim 11 wherein said device comprises a low energy Bluetooth Low Energy (BLE) tag.

17. The method of claim 11 wherein said event type comprises one or more categories of radio frequency transmissions.

18. The method of claim 11 wherein said event type comprises one or more categories of Bluetooth Low Energy (BLE) location scans.

\* \* \* \* \*